(12) United States Patent
Yahagi et al.

(10) Patent No.: US 8,483,785 B2
(45) Date of Patent: Jul. 9, 2013

(54) MOBILE ELECTRONIC DEVICE PROVIDING IMPACT RESISTANCE TO ELECTRONIC COMPONENT

(75) Inventors: Hiroto Yahagi, Yokohama (JP); Kenichi Ozasa, Yokohama (JP)

(73) Assignee: Kyocera Corporation, Kyoto (JP)

( * ) Notice: Subject to any disclaimer, the term of this patent is extended or adjusted under 35 U.S.C. 154(b) by 506 days.

(21) Appl. No.: 12/732,115

(22) Filed: Mar. 25, 2010

(65) Prior Publication Data

US 2010/0248655 A1 Sep. 30, 2010

(30) Foreign Application Priority Data

Mar. 26, 2009 (JP) .................................. 2009-77556
Mar. 26, 2009 (JP) .................................. 2009-77607

(51) Int. Cl.
*H04M 1/00* (2006.01)
*H04B 1/38* (2006.01)

(52) U.S. Cl.
USPC ....................................... 455/575.3; 455/90.3

(58) Field of Classification Search
USPC .................. 455/575.1, 575.7, 90.3, 128, 129, 455/347, 575.3; 361/679.01, 748, 752, 760, 361/784, 787, 814
See application file for complete search history.

(56) References Cited

U.S. PATENT DOCUMENTS

| | | | | |
|---|---|---|---|---|
| 4,623,207 A | * | 11/1986 | Sasaki et al. ..................... | 439/59 |
| 6,518,926 B2 | * | 2/2003 | Hulick et al. ................. | 343/702 |
| 7,349,723 B2 | * | 3/2008 | MacIntosh et al. ......... | 455/575.1 |
| 2003/0049950 A1 | * | 3/2003 | Ammar et al. ................. | 439/65 |
| 2010/0014267 A1 | * | 1/2010 | Kubota ......................... | 361/803 |
| 2010/0020512 A1 | * | 1/2010 | Batcheller et al. ............ | 361/752 |

FOREIGN PATENT DOCUMENTS

JP 2006-217050 8/2006

* cited by examiner

*Primary Examiner* — Nguyen Vo
(74) *Attorney, Agent, or Firm* — Duane Morris LLP

(57) ABSTRACT

An impact resistant mobile electronic device is disclosed. A case comprises a first circuit board and a second circuit board, and is elongated in a first direction. The second circuit board is smaller than the first circuit board and is elongated in a second direction substantially perpendicular to the first direction. The second circuit board comprises one or more electrical components elongated in a fourth direction. The first circuit board may be elongated in a third direction substantially perpendicular to the second direction.

16 Claims, 12 Drawing Sheets

MOBILE ELECTRONIC DEVICE PROVIDING IMPACT RESISTANCE TO ELECTRONIC COMPONENT

CROSS-REFERENCE TO RELATED APPLICATION

The present application claims priority under 35 U.S.C. §119 to Japanese Patent Application No. 2009-077556, filed on Mar. 26, 2009, entitled "MOBILE ELECTRONIC DEVICE" and Japanese Patent Application No. 2009-077607, filed on Mar. 26, 2009, entitled "MOBILE ELECTRONIC DEVICE". The contents of which are incorporated by reference herein in their entirety.

FIELD

Embodiments of the present invention relate generally to mobile electronic devices, and more particularly relate to a mobile electronic device comprising an antenna capable to communicate with other devices.

BACKGROUND

Portable electronic devices such as a mobile phone may comprise an antenna for radio communication such as a ceramic antenna mounted on a circuit board and located inside a case. Existing ceramic antennas may lose some functionality due to an impact, for example, an impact caused by dropping the mobile phone on a hard surface. When a portable electronic device impacts a hard surface, a circuit board in a portable electronic device may be deformed. Deformation of the circuit board may cause a ceramic antenna to peel off from a mounting structure of the circuit board and thereby lose some functionality. Thus, impacts to a portable electronic device due to dropping and the like are generally undesirable due to a potential loss of functionality of the portable electronic device.

Therefore, there is a need for a portable electronic device comprising electrical components resistant to lose of functionality caused by an impact.

SUMMARY

An impact resistant mobile electronic device is disclosed. A case comprises a first circuit board and a second circuit board, and is elongated in a first direction. The second circuit board is smaller than the first circuit board and is elongated in a second direction substantially perpendicular to the first direction. The second circuit board comprises one or more electrical components elongated in a fourth direction. The first circuit board may be elongated in a third direction substantially perpendicular to the second direction.

A first embodiment comprises a mobile electronic device. The mobile electronic device comprises a first case elongated in a first direction, and a first circuit board enclosed in the first case. The mobile electronic device further comprises a second circuit board smaller in size than the first circuit board, and enclosed in the first case. The second circuit board is elongated in a second direction substantially perpendicular to the first direction. The mobile electronic device also comprises one or more electrical components located on the second circuit board and elongated in a fourth direction.

A second embodiment comprises a method for providing an impact resistant mobile electronic device. The method comprises providing a first case elongated in a first direction, and providing a first circuit board in the first case. The method further comprises providing a second circuit board in the first case, and smaller than the first circuit board. The second circuit board is elongated in a second direction substantially perpendicular to the first direction. The method also comprises providing one or more electrical components on the second circuit board, elongated in a fourth direction.

BRIEF DESCRIPTION OF THE DRAWINGS

Embodiments of the present invention are hereinafter described in conjunction with the following figures, wherein like numerals denote like elements. The figures are provided for illustration and depict exemplary embodiments of the present invention. The figures are provided to facilitate understanding of the present invention without limiting the breadth, scope, scale, or applicability of the present invention. The drawings are not necessarily made to scale.

DETAILED DESCRIPTION OF EXEMPLARY EMBODIMENTS

The following description is presented to enable a person of ordinary skill in the art to make and use the embodiments of the invention. The following detailed description is exemplary in nature and is not intended to limit the invention or the application and uses of the embodiments of the invention.

Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the invention. Furthermore, there is no intention to be bound by any expressed or implied theory presented in the preceding technical field, background, brief summary or the following detailed description. The present invention should be accorded scope consistent with the claims, and not limited to the examples described and shown herein.

Embodiments of the invention are described herein in the context of one practical non-limiting application, namely, a mobile phone. Embodiments of the invention, however, are not limited to such mobile phones, and the techniques described herein may also be utilized in other applications. For example, embodiments may be applicable to digital cameras, electronic game machines, digital music players, personal digital assistance (PDA), personal handy phone system (PHS), lap top computers, and the like.

As would be apparent to one of ordinary skill in the art after reading this description, these are merely examples and the embodiments of the invention are not limited to operating in accordance with these examples. Other embodiments may be utilized and structural changes may be made without departing from the scope of the exemplary embodiments of the present invention.

Figure 1:
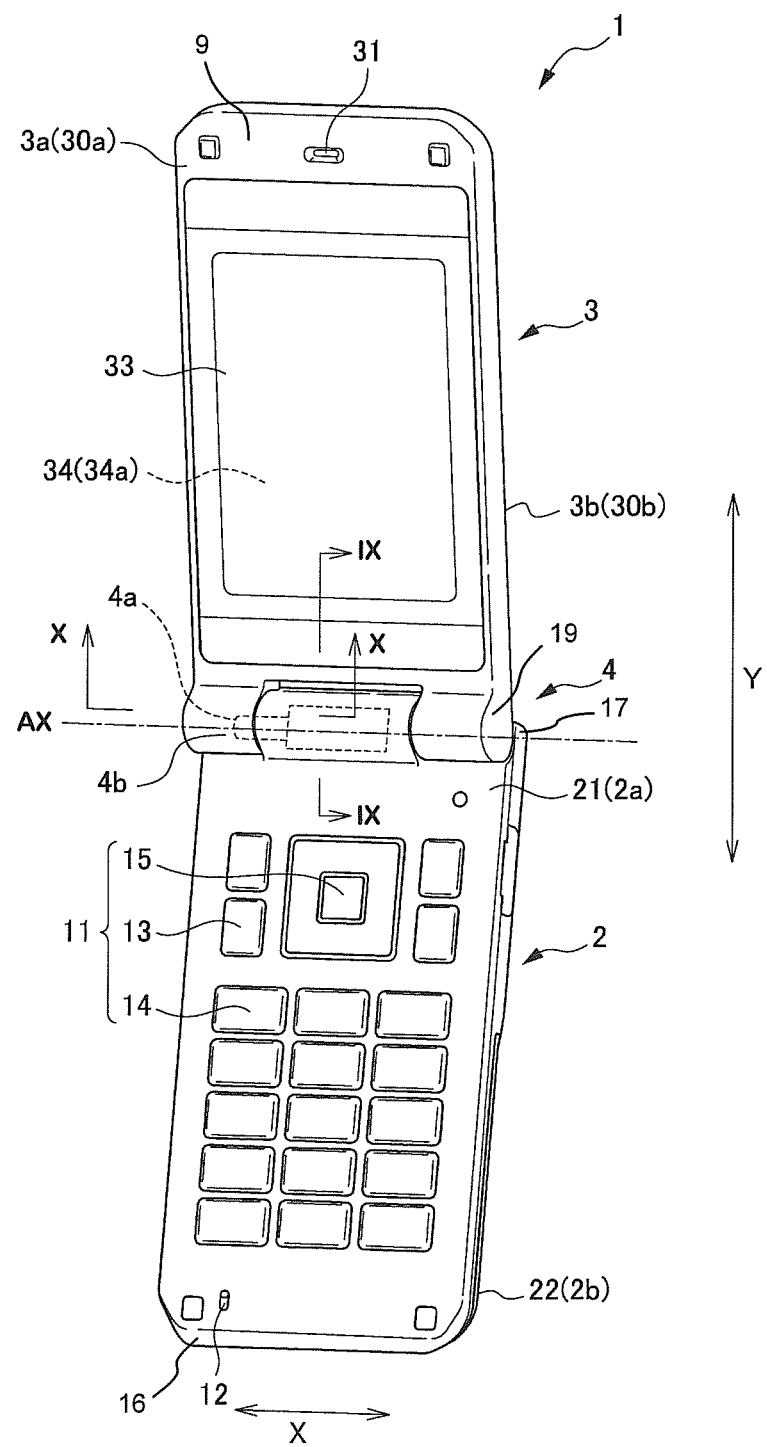
FIG. 1 is an illustration of a perspective view of a mobile phone in an opened state according to an embodiment of the present invention.
Figure 2:
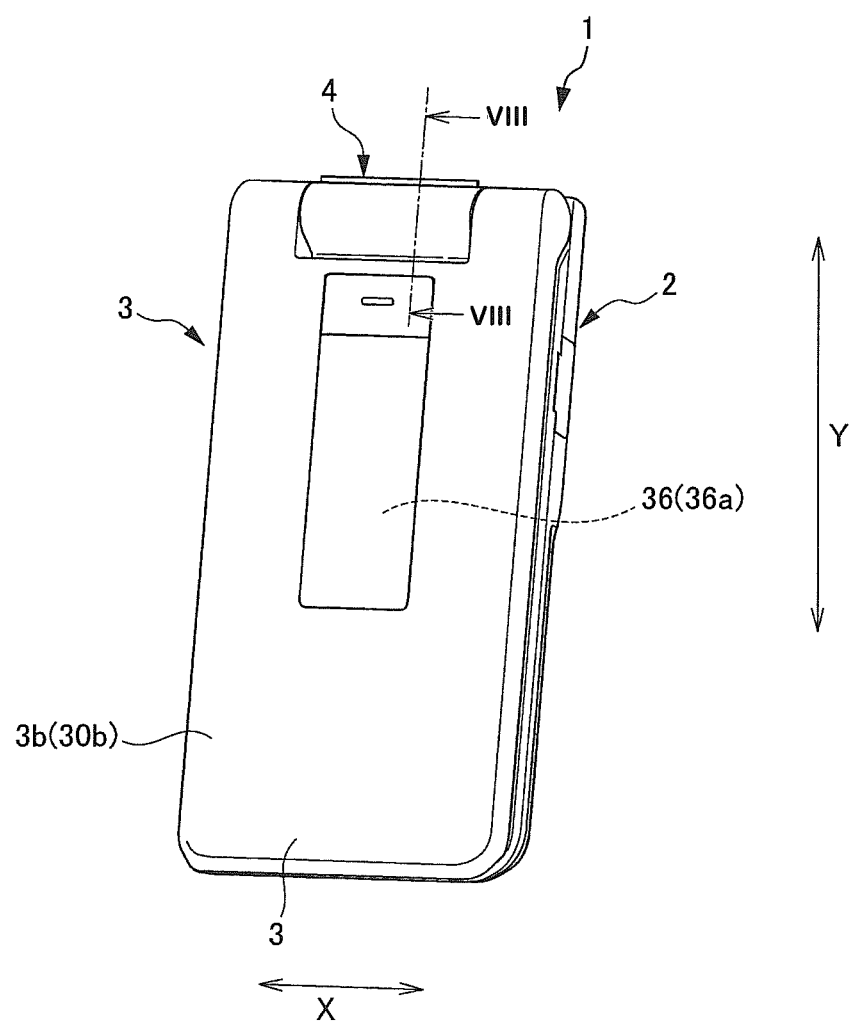
FIG. 2 is an illustration of a perspective view of a mobile phone in a closed state according to an embodiment of the present invention.

FIG. 1 is an illustration of a perspective view of a mobile phone 1 in an opened state according to an embodiment of the invention. FIG. 2 is an illustration of a perspective view of the mobile phone 1 in a closed state according to an embodiment of the invention. As shown in FIG. 1, X denotes a width direction of a mobile phone 1, and a Y denotes a longitudinal direction (fourth direction) of the mobile phone 1.

In the embodiment shown in FIG. 1, the mobile phone 1 is a folding type, and comprises a first case (manipulation-side case) 2, a second case (display-side case) 3, and a coupling portion 4. Alternatively, the mobile phone 1 may be, for example but without limitation, a sliding type in which the first case 2 and the second case 3 can slide in one direction from a state where the first case 2 and the second case 3 are overlapped, a turning type in which one of the cases 2/3 is made to turn around an axis line along an overlapping direction of the first case 2 and the second case 3, a straight type in which the first case 2 and the second case 3 are arranged in one case having no coupling portion, and the like.

The first case 2 and the second case 3 may be elongated in the Y direction. Shape of the first case 2 and the second case 3 may be, for example but without limitation, substantially cuboid, and the like.

An upper end portion 17 of the first case 2 and a lower end portion 19 of the second case 3 are coupled by the coupling portion 4. The coupling portion 4 may be provided with a cylindrical hinge member 4a and a containing portion 4b which detachably contains the cylindrical hinge member 4a. The containing portion 4b is located on one end side in a direction of an opening and closing axis of the coupling portion 4. The containing portion 4b is located so as to straddle the first case 2 and the second case 3. The cylindrical hinge member 4a is contained in the containing portion 4b so as to straddle the first case 2 and the second case 3 along the opening and closing axis direction. The cylindrical hinge member 4a is detachable.

The second case 3 and the first case 2 can be opened or closed around center of the opening and closing axis of the coupling portion 4. The first case 2 and the second case 3 can rotate relative to each other (pivot) using the coupling portion 4. In this manner, the mobile phone 1 has an opened state where the first case 2 and the second case 3 are opened relative to each other and a closed state where the first case 2 and the second case 3 are folded on to each other.

The first case 2 comprises a front case 21 and a rear case 22, both of which form a shell. A front surface 2a of the first case 2 comprises the front case 21. A rear surface 2b on an opposite side to the front surface 2a of the first case 2 comprises the rear case 22.

The front surface 2a may comprise an operation key group 11. The operation key group 11 may be provided with a function setting operation keys 13 which are configured to operate various functions such as various settings, a phonebook function, an e-mail function, and the like; input operation keys 14 such as a numeric keypad which is configured for inputting phone number numerals, e-mail characters, and the like; and a determination operation key 15 which is configured to perform determination of various operations and scrolling in a left, right, top, and bottom directions.

Predetermined functions are allocated (key assignment) to each key of the operation key group 11 based on the open and close states of the first case 2 and the second case 3 and application types. When a key of the operation key group 11 is pressed or activated by a user, operation corresponding to functions allocated to that key is executed.

The front surface 2a comprises a voice input unit 12 to which, for example but without limitation, a voice spoken by the user of the mobile phone 1 during a telephone conversation and the like may be inputted. The voice input unit 12 may be located near the end portion 16 (lower end portion 16) on the opposite side to the coupling portion 4 in the longitudinal direction Y of the first case 2.

The second case 3 comprises a front case 30a, a cover member 33, and a rear case 30b. A front surface 3a of the second case 3 comprises the front case 30a and the cover member 33. A rear surface 3b is located on the opposite side to the front surface 3a of the second case 3 and comprises the rear case 30b.

A main liquid crystal module 34 can display various kinds of information provided by a controller (not shown) inside the second case 3. The main liquid crystal module 34 comprises a main display unit 34a. The main display unit 34a is visible from the front side of surface 3a of the second case 3 via the cover member 33 comprising at least one transparent part.

The front case 30a comprises a voice output unit 31 that may, for example but without limitation, output a voice of a caller. The voice output unit 31 may be located at an end portion 9 of the second case 3 in the direction Y.

The rear case 30b of the second case 3 comprises a sub liquid crystal module 36 that can display various kinds of information. The sub liquid crystal module 36 comprises a sub display unit 36a. The sub display unit 36a is visible from the rear surface 3b side of the second case 3 via a transparent portion of the rear case 30b.

The main liquid crystal module 34 and the sub liquid crystal module 36 each comprise a liquid crystal panel (not shown), a drive circuit (not shown) which drives a liquid crystal panel, and a backlight (not shown) which irradiates light from the rear surface side of the liquid crystal panel.

Figure 3:
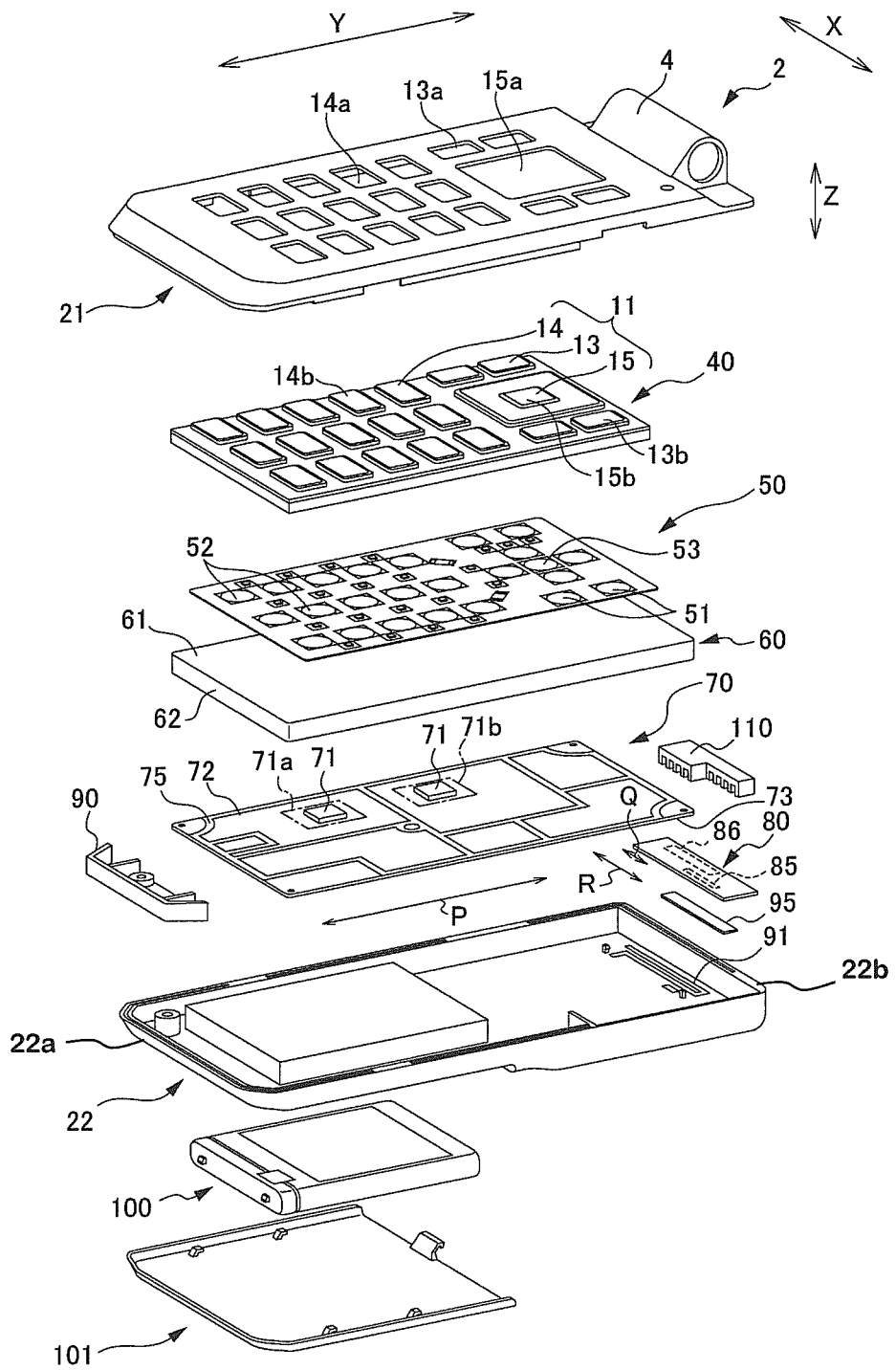
FIG. 3 is an illustration of an exploded perspective view of a first case according to an embodiment of the invention.
Figure 4:
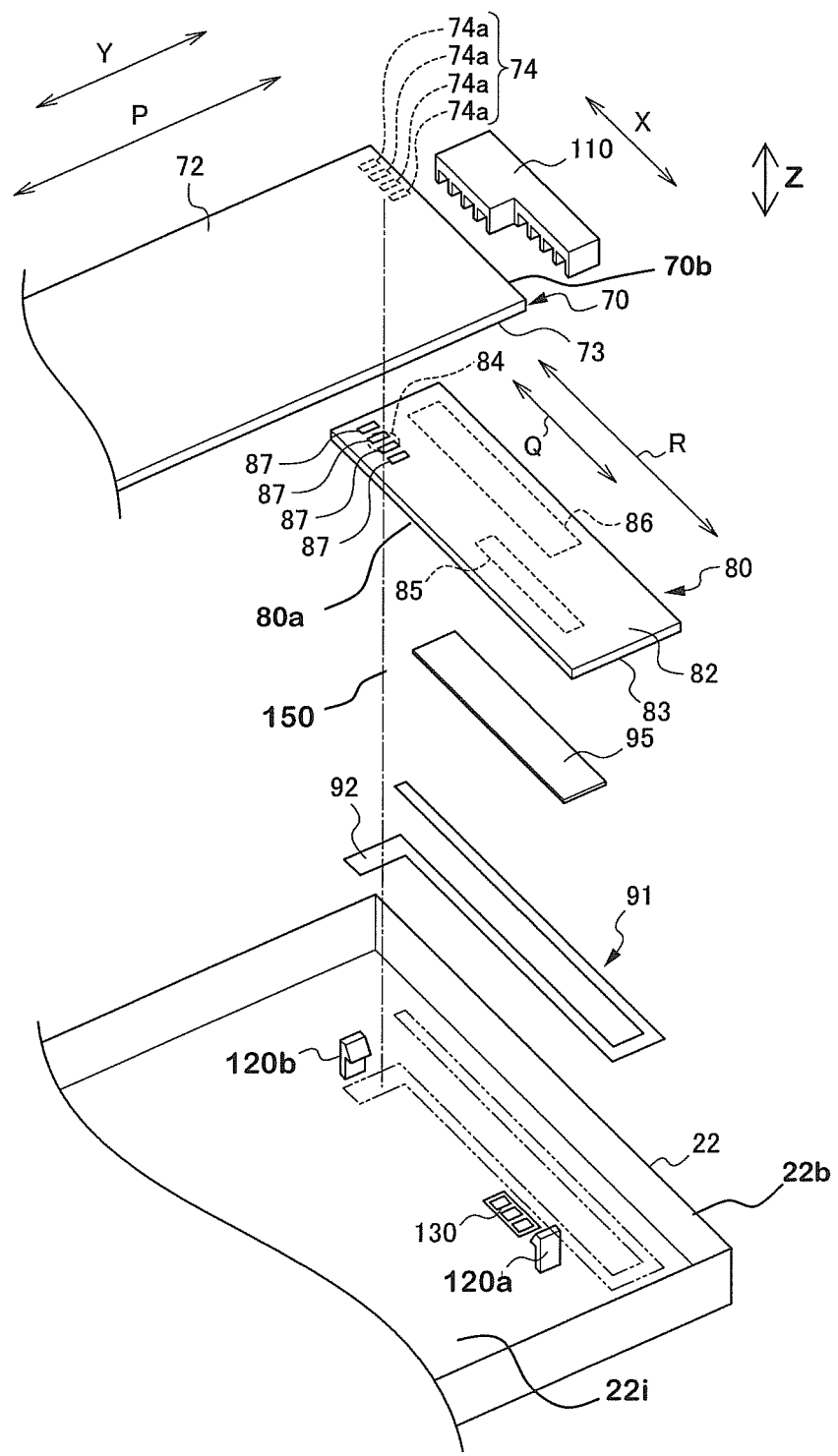
FIG. 4 is an illustration of an enlarged exploded perspective view of a portion of the exploded perspective view of a first case shown in FIG. 3 according to an embodiment of the invention.

FIG. 3 is an illustration of an exploded perspective view of the first case 2 according to an embodiment of the invention. FIG. 4 is an illustration of an enlarged exploded perspective view of a portion of the exploded perspective view of the first case shown in FIG. 3 according to an embodiment of the invention.

As shown in FIG. 3, Z is a thickness direction of the mobile phone 1 and is perpendicular to the directions X and Y. A direction P (first direction) is a longitudinal direction of a first circuit board, a direction Q (third direction) is a longitudinal direction of a first electrical component (digital television antenna or digital TV antenna), and a direction R (second direction) is a longitudinal direction of a second circuit board.

The front case 21 and the rear case 22 comprise concave internal surfaces that face each other, and have outer peripheral edges that are coupled so as to overlap with each other. The first case 2 comprises a keypad 40, a key circuit board 50, a shield case 60, a first circuit board (first circuit board) 70, a second circuit board (second circuit board) 80, a regulating member 110, a main antenna (MA) 90, a sheet member 95, and an antenna element (second electrical component) 91.

The front case 21 comprises key holes 13a, 14a, and 15a. The key holes 13a, 14a, and 15a correspond to the function setting operation key 13, the input operation key 14, and the determination operation key 15, respectively. A press surface of a function setting operation key member 13b, a press surface of an input operation key member 14b, and a press surface of a determination operation key member 15b are exposed from the respective holes.

The key circuit board 50 may be a flexible circuit board. The flexible circuit board comprises a plurality of insulating layers (insulating film) and wiring sandwiched therebetween. The key circuit board 50 is placed on a flat plate portion 61 of the shield case 60. The surface on the keypad 40 side of the key circuit board 50 comprises a plurality of key switches 51, 52, and 53. The plurality of key switches 51, 52, and 53 correspond to the function setting operation key 13, the input operation key 14, and the determination operation key 15, respectively. The key switches 51, 52, and 53 each comprise a metal dome of a metal plate curved in a bowl-shape and formed in three dimensions. When the press surfaces of 13b, 14b, and 15b are pressed, bowl-shaped tops of the metal domes are pressed to come in contact with switch terminals which are formed in an electric circuit (not shown) printed on the surface of the key circuit board 50; and accordingly, electrical continuity is provided.

The keypad 40 corresponds to the key circuit board 50. The keypad 40 has the pressing pieces operable for pressing the plurality of key switches 51, 52, and 53, key tops having press surfaces of the operation key group 11, and a circuit board sheet including silicon rubber having elasticity. The function setting operation key 13, the input operation key 14, and the determination operation key 15 are located in face-to-face relation with the key switches 51, 52, and 53 of the key circuit board 50, respectively.

The shield case 60 may have a shape in which a wide surface of one of a thin cuboid is open and operable to conduct. The shield case 60 comprises the flat plate portion 61 and ribs 62. The rib 62 may be equal to or greater than the height of the highest electronic component of various electronic components to be mounted on the first circuit board 70. The ribs 62 are wall surface portions provided on the peripheral edges of the flat plate portion 61 and are substantially perpendicular to the flat plate portion 61; and the ribs 62 correspond to a reference potential pattern layer 75 of the first circuit board 70 on the peripheral edges and the inside of the flat plate portion 61. More specifically, the ribs 62 are located above the reference potential pattern layer 75 in a state where the shield case 60 is placed on the first circuit board 70.

Ends of the ribs 62 come in contact with the reference potential pattern layer 75 and the shield case 60 is electrically coupled to the reference potential pattern layer 75. The shield case 60 can have the same potential as that of the reference potential pattern layer 75.

The shield case 60 reduces an effect of noise such as a high frequency from an outside the shield case 60 on various electronic components arranged on the first circuit board 70. In addition, the shield case 60 shields noise emitted from a radio frequency (RF) circuit, a central processing unit (CPU) circuit, a power supply circuit, and the like to reduce the effect of the noise on a receiver circuit and the like to be connected to other electronic component and an antenna. More specifically, the above described circuits are surrounded by the ribs 62 and covered with a part of the flat plate portion 61. The ribs 62 shield the respective circuits as well as the part of the flat plate portion 61.

The shield case may have conductivity. The shield case 60 can contain metal, and may be made of substantially entirely or in part of metal. A framework of the shield case 60 may have resin or the surface of the framework may be provided with a conductive film.

The first circuit board 70 may be elongated in the direction P (first direction). The direction P may be substantially parallel to the direction Y. A first surface 72 of the first circuit board 70 has a plurality of various electronic components 71 and circuits. The various electronic components have a plurality of circuit blocks according to a predetermined combination. For example, the circuit blocks comprise the CPU circuit, a radio unit 71a (wireless communication unit), a circuit block of an analog processing system such as a radio unit 71b, and various circuit blocks including the power supply circuit.

The radio unit 71a performs radio communication with, for example but without limitation, an external device (base station) connected to a public radio communication network using a predetermined frequency band, and the like. The radio unit 71a performs demodulation process of signals received from an antenna such as a main antenna 90 and a sub antenna 85 (first electrical component) and the like and supplies the processed signals to the CPU circuit. The radio unit 71a performs modulation process of the signals supplied from the CPU circuit and transmits from antennas such as a main antenna 90 and the sub antenna 85 to the external device. The radio unit 71b may be coupled to, for example but without limitation, a digital TV antenna 86 (first electrical component), and the like, and transmits the signals received by the antenna to a CPU.

The first surface 72 comprises the reference potential pattern layer 75, which constitutes a reference potential portion in addition to the aforementioned various electronic components. The reference potential pattern layer 75 divides the aforementioned respective circuit blocks. The reference potential pattern layer 75 may be formed by printing a conductive member on the surface of the first surface 72 of the first circuit board 70 in a predetermined pattern.

Figure 5:
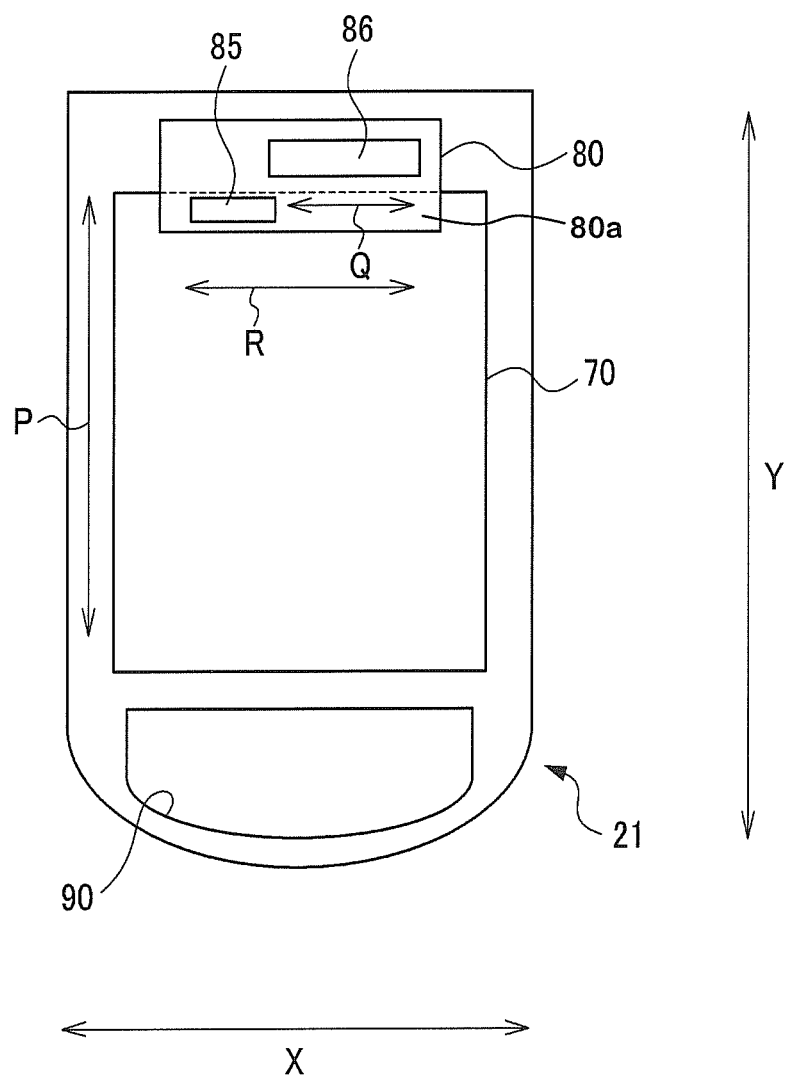
FIG. 5 is an illustration of a schematic top view showing a positional relationship between a first circuit board and a second circuit board according to an embodiment of the invention.
Figure 6:
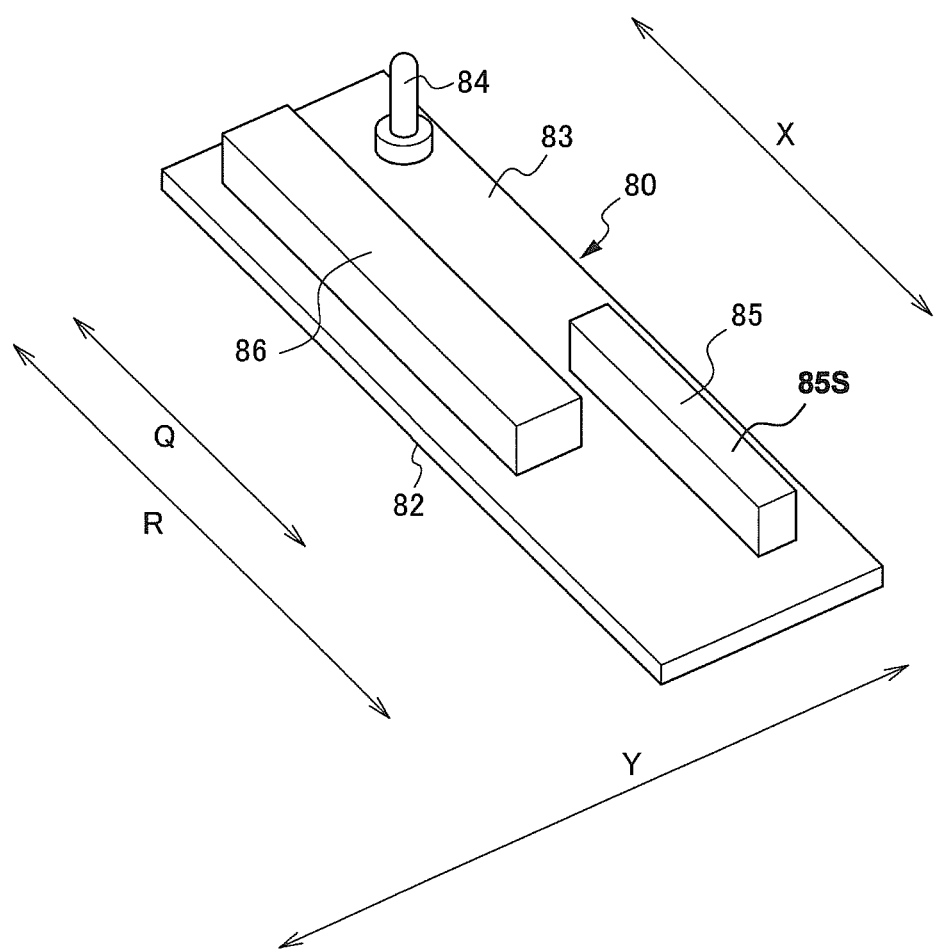
FIG. 6 is an illustration of a perspective view of a second circuit board viewed from a side where electrical components are mounted according to an embodiment of the invention.
Figure 7:
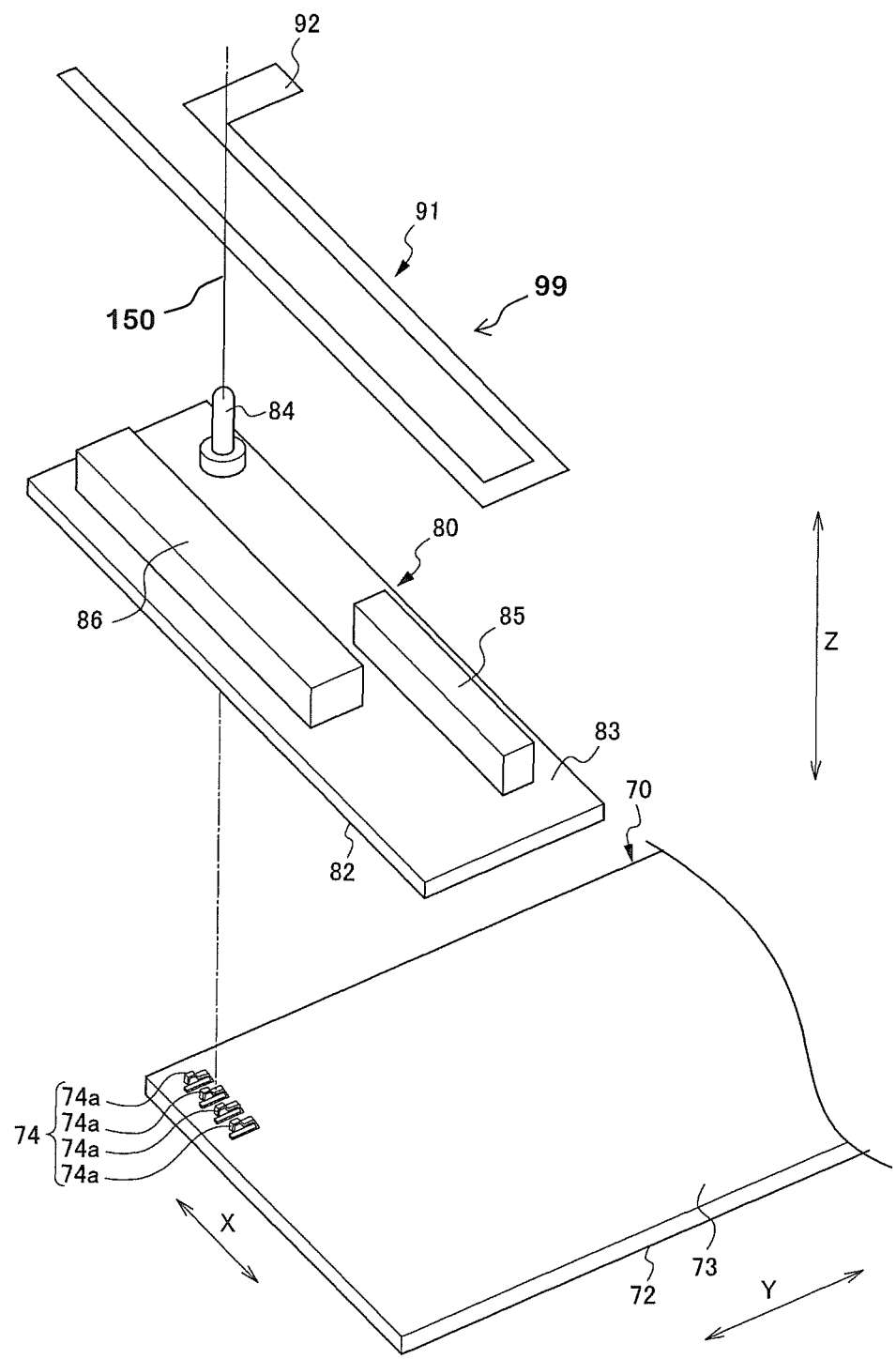
FIG. 7 is an illustration of an exploded partial perspective view showing connection between a second circuit board and each of upper and lower components according to an embodiment of the invention.

FIG. 5 is an illustration of a schematic top view showing a positional relationship between the first circuit board and the second circuit board according to an embodiment of the invention. FIG. 6 is an illustration of a perspective view of the second circuit board viewed from the side where electrical components are mounted according to an embodiment of the invention. FIG. 7 is an illustration of an exploded partial perspective view showing connection between the second circuit board and each of upper and lower components according to an embodiment of the invention. FIGS. 6 and 7 are shown from a fourth surface 83 side.

A second surface 73 of the first circuit board 70 comprises a first spring terminal (plate spring terminal) 74. The plate spring terminal 74 comprises four tub terminals 74a. Four tub terminals 74a are located at an end portion on the coupling portion 4 side in the direction Y arranged in parallel to the direction X.

The plate spring terminal 74 is located between the first circuit board 70 and the second circuit board 80 in a direction Z. The thickness direction of the first circuit board 70 and the thickness direction of the second circuit board 80 may be substantially parallel to the direction Z.

The plate spring terminal 74 comes in contact with the third surface 82 that is the surface on the first circuit board 70 side of the second circuit board 80; and accordingly, the first circuit board 70 and the second circuit board 80 are electrically coupled. The plate spring terminal 74 biases the second circuit board 80 in a direction that the second circuit board 80 is toward the antenna element 91 side. Alternatively, the plate spring terminal 74 may be mounted on the second circuit board 80 and may come in contact with the first circuit board 70.

The second circuit board 80 is elongated in the direction R (second direction). The second circuit board 80 is located at an end portion 22b on the coupling portion 4 side of the rear case 22. The second circuit board 80 may be a substantially rectangular shape. The second circuit board 80 is smaller than the first circuit board 70. The second circuit board 80 is located on the second surface 73 side of the first circuit board 70 in the direction Z. At least a part of the first circuit board 70 faces at least a part of the second circuit board 80. In other words, the first circuit board 70 and the second circuit board 80 are overlapped at least a portion 80a seen from the top (FIG. 5). In one embodiment, the overlapped portion 80a comprises the sub antenna 85.

The second circuit board 80 may be elongated in the width direction of the first case 2. That is, the direction X and the direction R may be substantially parallel. The second circuit board 80 may be substantially perpendicular to the longitudinal direction Y of the first case 2. That is, the direction R is substantially perpendicular to the direction Y. The first circuit board 70 may be substantially perpendicular to the second circuit board 80. That is, the direction P may be substantially perpendicular to the direction R. The sub antenna 85 may be substantially parallel to the digital TV antenna. That is, the sub antenna 85 serving as the first electronic component may substantially coincide with the longitudinal direction of the digital TV antenna.

The third surface 82 of the second circuit board 80 is toward the first circuit board 70. A portion 82a of the third surface 82 faces the second surface 73 in the direction Z. The vicinity of the end portion 80a of the second circuit board 80, which is located opposite to the coupling portion 4 side, faces the vicinity of an end portion 70b of the first circuit board 70, which is located on the coupling portion 4 side.

The third surface 82 has first supply terminals 87. The first supply terminals 87 come in contact with the plate spring terminal 74 and are electrically connected. The first supply terminals 87 are located at a position 150 corresponding to the plate spring terminal 74 near the end portion 80a of the second circuit board 80, on the opposite side to the first case a coupling portion 4 or on the opposite side to the coupling portion 4 of the rear case 22 in the direction Y, and on the opposite side of the end portion 22b on the coupling portion 4 side.

A spring pin terminal (second spring terminal) 84 comes in contact with the antenna element 91 at the position 150. If the second spring terminal 84 has conductivity, the second circuit board 80 and the antenna element 91 are electrically connected. If the second spring terminal 84 is electrically connected to the digital TV antenna 86, the antenna element 91 is electrically connected to the digital TV antenna 86, and an enlarged antenna 99 is formed. The enlarged antenna 99 comprises the antenna element 91, the digital TV antenna 86, and the second spring terminal 84. The enlarged antenna 99 may comprise a connection wire (not shown) which electrically connects the digital TV antenna 86 to the second spring terminal 84. This extends the effective length of the digital TV antenna 86. That is, the enlarged antenna 99 may comprise the aforementioned connection wire in addition to the effective length of the antenna element 91, the length of the digital TV antenna 86, and the length of the second spring terminal 84. Alternatively, the spring pin terminal 84 may be mounted on the antenna element 91 and may come in contact with the second circuit board 80.

The fourth surface 83 is a surface on the rear case 22 side of the second circuit board 80. The fourth surface 83 comprises the conductive spring pin terminal 84 serving as the second spring terminal, the sub antenna 85 serving as the first electrical component, and the digital TV antenna 86. The spring pin terminal 84 is located between the second circuit board 80 and the antenna element 91 in the direction Z. The second circuit board 80 may comprise an electronic component other than the antenna, serving as the first electrical component.

The sub antenna 85 and the digital TV antenna (first antenna) 86 has a substantially cuboid elongated in the direction X. The direction of the sub antenna 85 and the digital TV antenna 86 substantially coincide with the direction of the second circuit board 80 (direction X). The directions of the sub antenna 85 and the digital TV antenna 86 are substantially orthogonal to the direction of the first circuit board 70 (direction Y).

As shown in FIGS. 3 and 4, the main antenna 90 is located at an end portion (22a) on the opposite side to the coupling portion 4 on the first case 2 (rear case 22). The main antenna 90 is electrically coupled to the first circuit board 70 via wiring (not shown).

A detachable battery lid 101 is provided on the end portion 22a side of the rear case 22. The battery lid 101 is attached to the rear case 22 after a battery 100 is incorporated from the outside of the rear case 22.

The spring pin terminal 84 biases the second circuit board 80 to a direction (S) to which the second circuit board 80 is toward the first circuit board 70 side in the direction Z.

The plate spring terminal 74 substantially faces the spring pin terminal 84 via the second circuit board 80. The plate spring terminal 74 and the spring pin terminal 84 are located at an overlapped position in the direction Z and bias the second circuit board 80 in opposite directions with each other; and therefore, the second circuit board 80 is flexibly held so as to absorb an impact on the second circuit board 80. Consequently, the impact on the second circuit board 80 can be reduced even when the impact is applied to the mobile phone 1.

A first spring constant of the plate spring terminal 74 may be set larger than a second spring constant of the spring pin terminal 84. This allows the plate spring terminal 74 and the spring pin terminal 84 to flexibly hold the second circuit board 80 so as to maintain a balance in spring force at a position where the second circuit board 80 come close to the rear case 22 side and to absorb the impact on the second circuit board 80. According to an embodiment, in the direction Z, for example, the length of the plate spring terminal 74 is shorter than that of the spring pin terminal 84, and therefore, a range of compression and extension (distance) of the plate spring terminal 74 is smaller than that of the spring pin terminal 84. As described above, the plate spring terminal 74 has four tub terminals 74a. This allows the first spring constant of the plate spring terminal 74 to be set larger than the second spring constant of the spring pin terminal 84.

The digital TV antenna (first antenna) 86 is mounted on the second circuit board 80. The digital TV antenna 86 may be a substantially cuboid shape elongated in the direction Q (third direction) of the digital TV antenna 86. The direction Q (third direction) of the digital TV antenna 86 may be substantially parallel to the direction R (second direction) in the second circuit board 80. The digital TV antenna 86 is arranged so that the direction Q (third direction) is substantially orthogonal to the direction Y (fourth direction). In the digital TV antenna 86, the direction Q (third direction) is substantially orthogonal to the direction P (first direction) in the first circuit board 70.

The sub antenna 85 may be a cuboid shape elongated in the direction of the sub antenna 85. The sub antenna 85 may be arranged so that the direction of the sub antenna 85 coincides with (parallels to) the direction Q of the digital TV antenna 86. That is, a positional relationship in the sub antenna 85 with respect to each of the second circuit board 80, the first circuit board 70, and the first case 2 is the same as a positional relationship in the digital TV antenna 86 with respect to each of the second circuit board 80, the first circuit board 70, and the first case 2.

The sub antenna 85 may be smaller than the digital TV antenna 86. The sub antenna 85 and the digital TV antenna 86 may be, for example but without limitation, an antenna in which ceramic material is partially used, and the like.

The ceramic antenna is used as an example of the electrical component mounted on the second circuit board 80, however, other electrical component, such as without limitation, a ceramic capacitor, a ceramic module circuit board, and the like may be used. In this case, a component susceptible to an impact such as a drop and compatible with electrical components arranged on the sides of the case 2/3 may be used.

The sub antenna 85 and the digital TV antenna 86 are arranged in parallel to the direction Y. The digital TV antenna 86 is located nearer to the coupling portion 4 side than the sub antenna 85 in the direction Y (FIG. 3).

Figure 8:
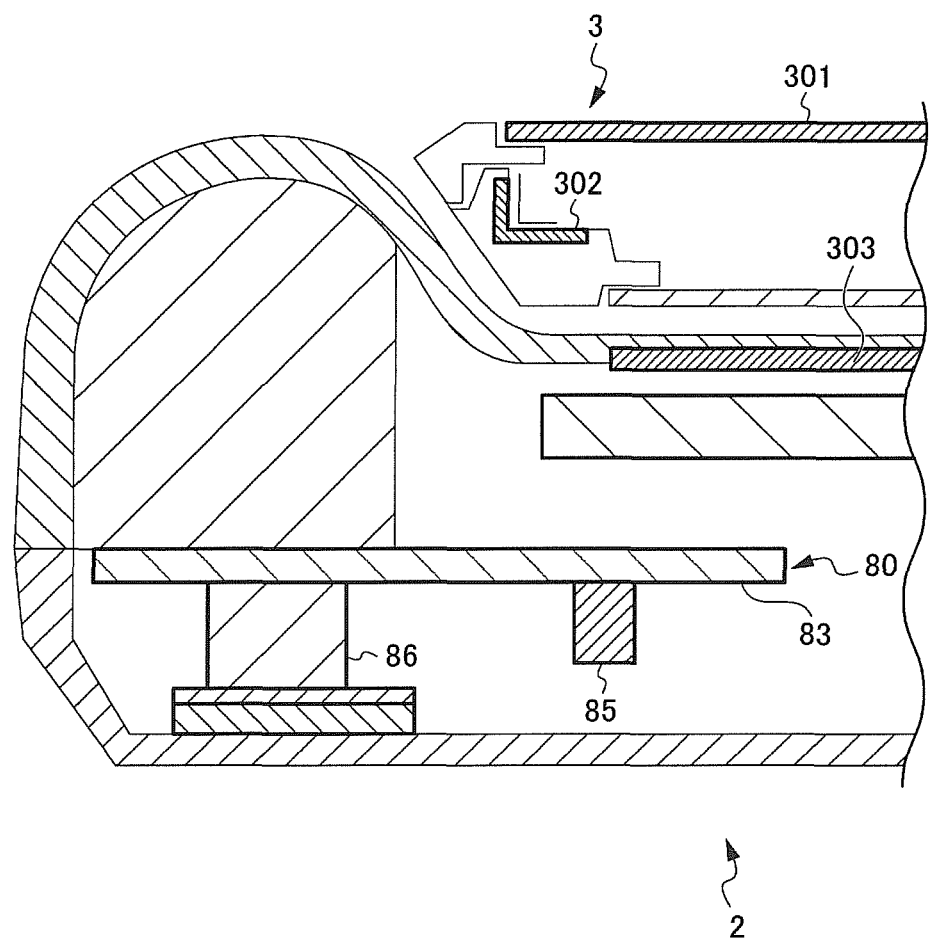
FIG. 8 is an illustration a sectional view taken along a line VIII-VIII of a mobile phone shown in FIG. 2 according to an embodiment of the invention.

FIG. 8 is an illustration of a sectional view taken along the line VIII-VIII of the mobile phone 1 shown in FIG. 2 according to an embodiment of the invention. In the closed state of the mobile phone 1, the sub antenna 85 and the digital TV antenna 86 mounted on the fourth surface 83 of the second circuit board 80 is located apart from metal members formed on the second case 3 or the like by a predetermined distance. More specifically, in the closed state of the mobile phone 1, the sub antenna 85 and the digital TV antenna 86 mounted on the fourth surface 83 of the second circuit board 80 are located apart from a metallic insert sheet-metal 302 and a metallic panel member 301 which are formed on the second case 3 and a metallic insert sheet-metal 303 which is formed on an operation surface side of the first case 2. This reduces deterioration of antenna characteristics of the sub antenna 85 and the digital TV antenna 86 as compared to the case where the sub antenna 85 and the digital TV antenna 86 are mounted on the first circuit board 70.

Figure 9:
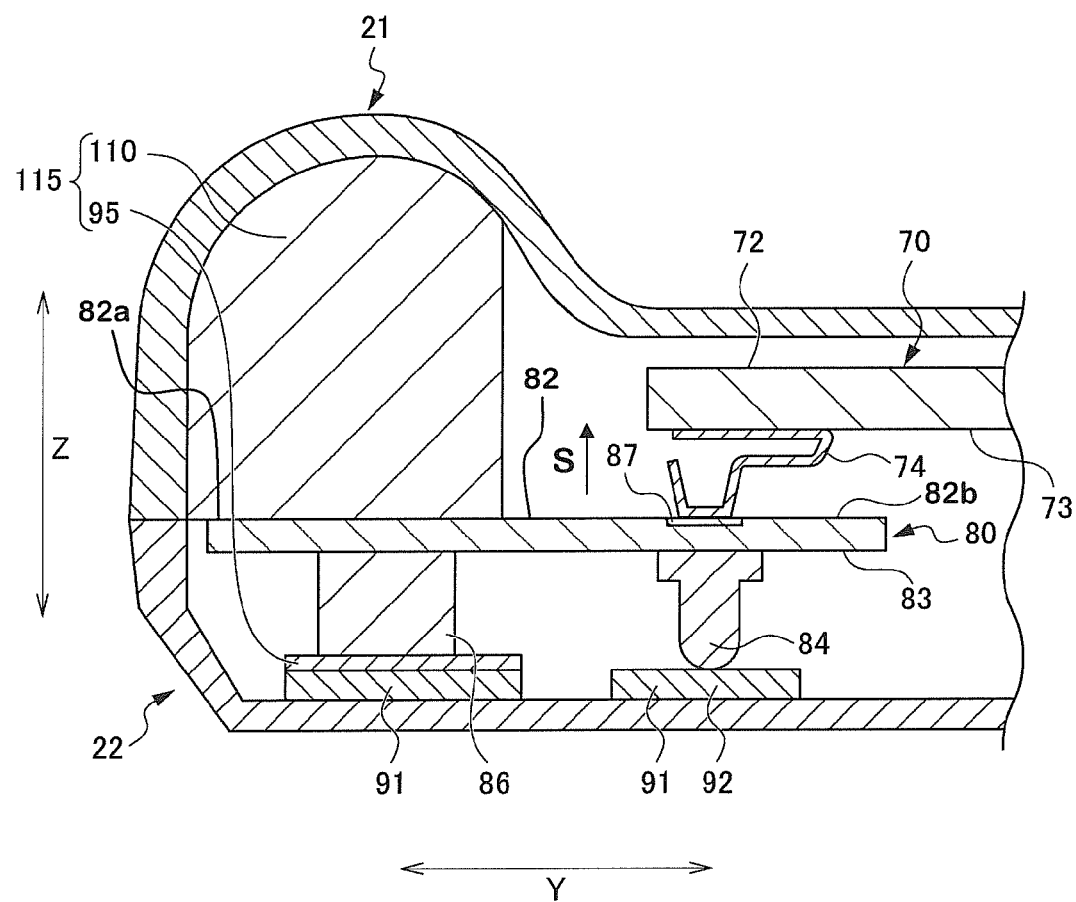
FIG. 9 is an illustration of a sectional view taken along a line IX-IX of a mobile phone shown in FIG. 1 according to an embodiment of the invention.

FIG. 9 is an illustration of a sectional view taken along a line IX-IX of the mobile phone 1 shown in FIG. 1 according to an embodiment of the invention. A fixed portion 115 comprises a first structure (regulating member) 110 and a second structure (sheet member) 95. The fixed portion 115 fixes one end portion 82a of the second circuit board 80. The sheet member 95 is located on the rear case 22 side with respect to the second circuit board 80. The regulating member 110 and the sheet member 95 are fixed so as to sandwich the second circuit board 80.

Figure 10:
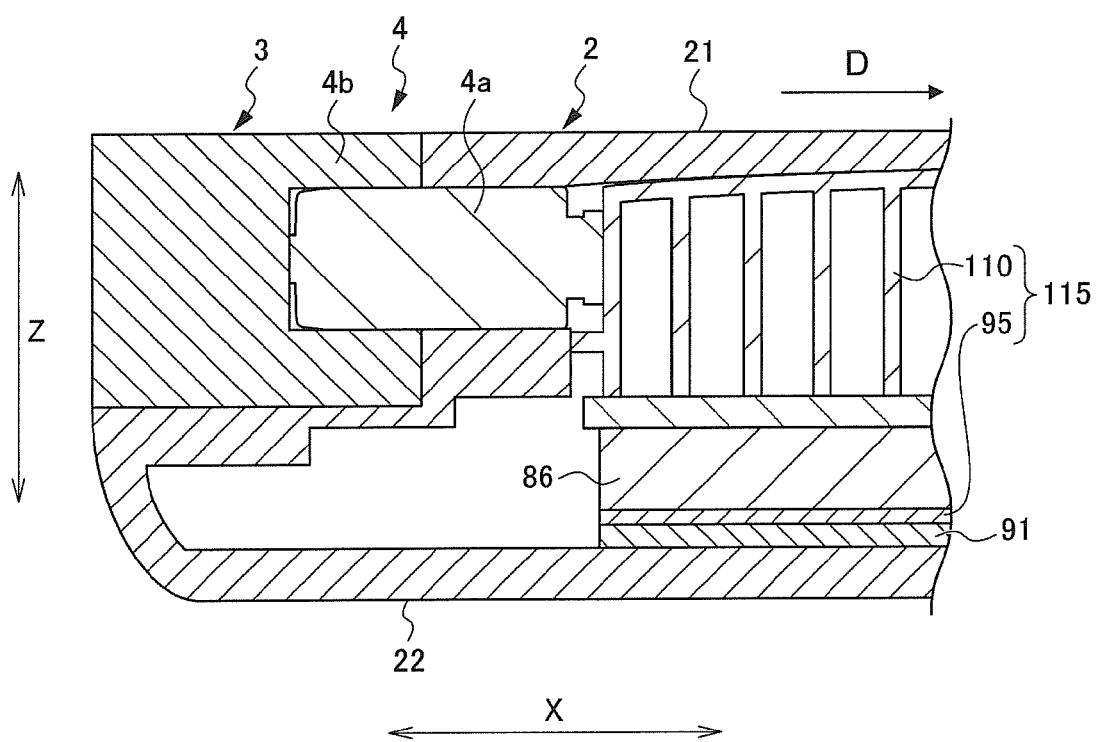
FIG. 10 is an illustration of a sectional view taken along a line X-X of a first case shown in FIG. 1 according to an embodiment of the invention.

FIG. 10 is an illustration of a sectional view taken along the line X-X of the first case shown in FIG. 1 according to an embodiment of the invention. The regulating member 110 comes in contact with the hinge member 4a from the inner side of the first case 2 as shown in FIG. 8, and regulates a movement to a separation direction D of the hinge member 4a incorporated in the containing portion 4b of the coupling portion 4. The separation direction D is a movement direction to the inner side of the first case 2 in the direction X.

As shown in FIG. 9, the regulating member 110 comes in contact with one end side 82a on the third surface 82 of the second circuit board 80 in the aforementioned state where the regulating member 110 comes in contact with the hinge member 4a. That is, the regulating member 110 comes in contact with the hinge member 4a and the third surface 82.

On the other hand, the other end portion 82b of the second circuit board 80 in the direction Y is not fixed by the fixed portion 115, and is a free end. The plate spring terminal 74 comes in contact with the first supply terminals 87 located closer to the other end portion 82b than the center of the direction Y of the second circuit board 80. The spring pin terminal 84 is located on the fourth surface 83 on the opposite side thereto.

A part of the antenna element 91 is covered with the sheet member 95. The antenna element 91 is located at one end 22b on the coupling portion 4 side of the rear case 22. That is, the antenna element 91 is located apart from the aforementioned main antenna 90 on both ends in the direction Y of the first case 2 (rear case 22). The antenna element 91 may be, for example but without limitation, a metal member formed in a thin film shape, and the like. The antenna element 91 may be fixed to the rear case 22. The antenna element 91 faces the fourth surface 83 of the second circuit board 80.

The antenna element 91 may be a band shape in order to ensure a predetermined length and may be substantially located over the whole area along the direction X. Alternatively, as shown in FIGS. 7 and 8, the antenna element 91 may be a reciprocated shape folded at one end portion in the direction X. The antenna element 91 may have a second supply terminal 92 on the end portion thereof at a position where the antenna element 91 comes in contact with the spring pin terminal 84. Although the antenna element 91 is used as the second electrical component 91 in this example, other electrical components may also be used.

Figure 11A:
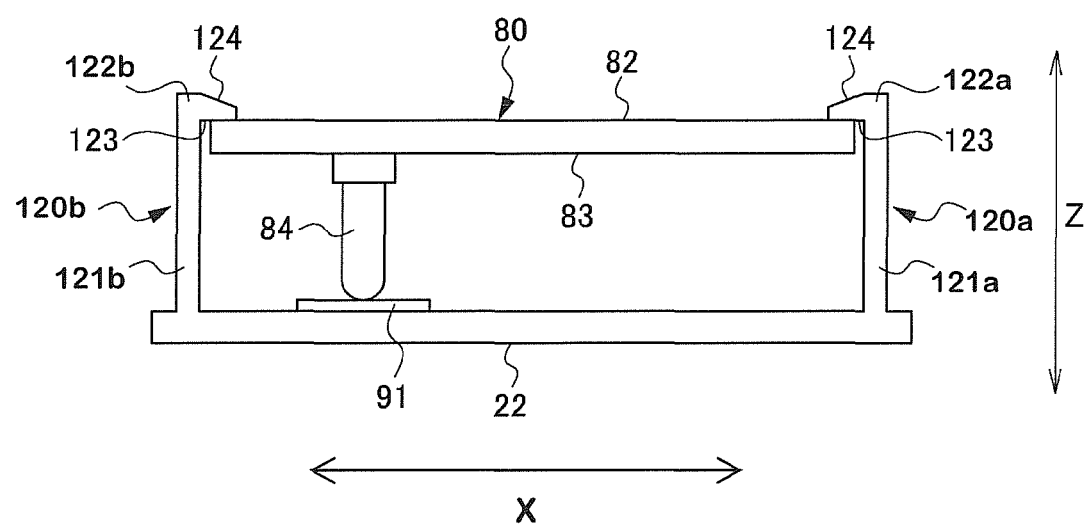
FIG. 11A is an illustration of a process for mounting a first circuit board and a second circuit board to a rear case showing a state where the second circuit board is mounted according to an embodiment of the invention.
Figure 11B:
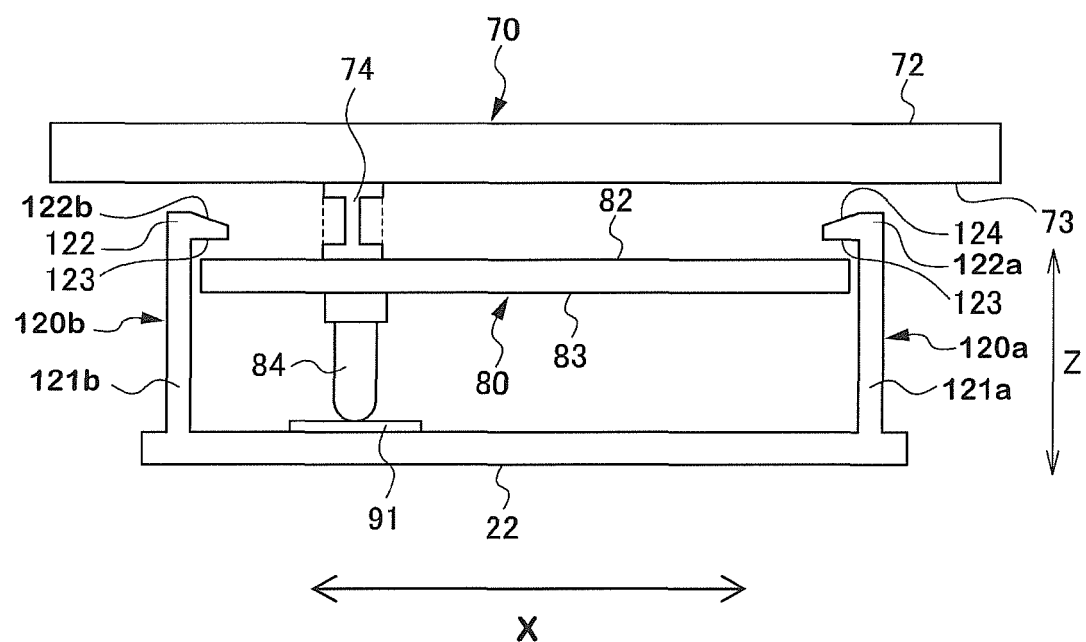
FIG. 11B is an illustration of a process for mounting a first circuit board and the second circuit board to the rear case showing a state where a first circuit board is mounted after a second circuit board is mounted according to an embodiment of the invention.

FIG. 11A is an illustration of a process for mounting the first circuit board 70 and the second circuit board 80 to the rear case 22 showing a state where the second circuit board 80 is mounted according to an embodiment of the invention. FIG. 11B is an illustration of a process for mounting the first circuit board 70 and the second circuit board 80 to the rear case 22 showing a state where the first circuit board 70 is mounted after the second circuit board 80 is mounted according to an embodiment of the invention.

The rear case 22 has two engaging members 120a and 120b capable of mounting the second circuit board 80 as shown in FIGS. 5 and 11A. The engaging members 120a and 120b each are arranged near both ends in the direction X. The engaging members 120a and 120b are engaged to both ends in the direction of the second circuit board 80 (direction X). Then, the engaging members 120a and 120b regulate a movement to the direction X and the direction Z of the second circuit board 80.

The engaging members 120a and 120b each have a base portion 121 and an engaging claw portion 122. Two base portions 121a and 121b each comprise a resin material that deflects due to external force and returns. The base portions 121a and 121b each are arranged with each other in face-to-face relation in the direction X. The second circuit board 80 is located between two base portions 121a and 121b. Two base portions 121a and 121b may be located near the antenna element 91 (FIG. 7).

Two base portions 121a and 121b each are extended from an inner surface 22i of the rear case 22 to the front case 21 side. The extending direction may be substantially perpendicular to the inner surface 22i.

The base portions 121a and 121b have engaging claw portions 122a and 122b at ends thereof, respectively. The engaging claw portions 122a and 122b each protrude from each end of the base portions 121a and 121b to come close to the direction X with each other. The engaging claw portions 122a and 122b each have an inclination-introducing portion 124 located at an end portion on the front case 21 side and an engaging surface 123 located at an end portion on the rear case 22 side.

The engaging surface 123 faces the rear case 22. The engaging surface 123 faces an end portion of the third surface 82 of the second circuit board 80. The engaging surface 123 comes in contact with or separates from the third surface 82 of the second circuit board 80, thereby regulating a movement to the direction (direction Z) in which the second circuit board 80 separates from the rear case 22.

The inclination-introducing portion 124 is located on the opposite side to engaging surfaces 123a and 123b in the direction Z of the engaging claw portions 122a and 122b. The inclination-introducing portion 124 has an inclined plane inclined to the second circuit board 80 side. The inclination-introducing portion 124 introduces the second circuit board 80 between two base portions 121a and 121b. The distance between two inclination-introducing portions 124 substantially coincides with the length of the direction of the second circuit board 80 (direction X).

The rear case 22 comprises a pad rib 130 at a position where an upper surface of the sub antenna 85 to be mounted on the second circuit board 80 (FIG. 6). An upper surface 85S of the sub antenna 85 on the opposite side to the second circuit board 80 comes in contact with the pad rib. The pad rib 130 reduces an impact on the sub antenna 85 at the moment of the impact, such as a drop of the mobile phone 1.

Process in which the first circuit board 70 and the second circuit board 80 are arranged inside the rear case 22 is described below.

First, as shown FIG. 11A, the second circuit board 80 is mounted on the engaging members 120a and 120b of the rear case 22. In this case, the second circuit board 80 is arranged in parallel to the inner surface of the rear case 22 and is moved in parallel to the inner surface side of the rear case 22. Then, both end portions of the second circuit board 80 are made to come in contact with the inclination introducing portion 124, respectively. Further, the second circuit board 80 is made to move to the rear case 22 side in a state where the second circuit board 80 comes in contact with the inclination introducing portion 124.

The base portions 121a and 121b of the engaging members 120a and 120b are deflected; and accordingly, the second circuit board 80 passes through the engaging claw portions 122a and 122b. Then, the deflection of the base portions 121a and 121b is returned; and accordingly, the second circuit board 80 is arranged between the base portions 121a and 121b on the rear case 22 side with respect to the engaging claw portions 122a and 122b.

In the aforementioned process in which the second circuit board 80 is introduced to the rear case 22 side with respect to the engaging claw portions 122a and 122b, the spring pin terminal 84 mounted to the second circuit board 80 comes in contact with the antenna element 91. Then, the second circuit board 80 is made to move to the rear case 22 side so as to resist against biasing force of the spring pin terminal 84 while applying a predetermined force to the second circuit board 80, and accordingly, the spring pin terminal 84 is made to be reduced. At a time when the second circuit board 80 is passed through the engaging claw portions 122a and 122b, the force applied to the second circuit board 80 is released.

In this case, the second circuit board 80 is biased to a separating direction from the rear case 22 by the biasing force of the spring pin terminal 84. The second circuit board 80 is biased to the engaging members 120a and 120b by the biasing force of the spring pin terminal 84 to engage with the engaging claw portions 122a and 122b.

Next, an arrangement is made such that the second surface 73 of the first circuit board 70 faces the third surface 82 of the second circuit board 80 as shown FIG. 11B. More specifically, the first circuit board 70 is arranged in parallel to the second circuit board 80 so that the plate spring terminal 74 comes in contact with the first supply terminals 87 mounted on the second circuit board 80 (FIG. 7). In this case, the second circuit board 80 is engaged with the engaging members 120a and 120b; and therefore, the second circuit board 80 is stably held. Therefore, in assembling work, workability in which the first circuit board 70 is arranged on the second circuit board 80 is easy.

Then, the first circuit board 70 is made to move to the rear case 22 side while applying force. The second circuit board 80 is biased by the plate spring terminal 74 and the spring pin terminal 84. In this case, the spring constant of the plate spring terminal 74 is larger than that of the spring pin terminal 84, and accordingly the second circuit board 80 moves to the rear case 22 side. The first circuit board 70 is arranged at a predetermined position, and accordingly, a biasing force of the plate spring terminal 74 balances with that of the spring pin terminal 84 and the second circuit board 80 is held at a predetermined position. Then, the second circuit board 80 is separated from the engaging claw portions 122a and 122b.

When the mobile phone 1 is dropped and impinged on the ground or the like, each case deforms so as to be deflected in the longitudinal direction. The first circuit board 70 in the first case 2 deforms so as to be deflected in the direction P (direction Y).

The sub antenna 85 and the digital TV antenna 86 are mounted on the second circuit board 80 different from the first circuit board 70; and therefore, the sub antenna 85 and the digital TV antenna 86 are difficult to be influenced by the deformation of the first circuit board 70. Consequently, loss of functionality of the sub antenna 85 and the digital TV antenna 86 is reduced.

The second circuit board 80 is arranged on the end portion side in the direction Y; and therefore, the second circuit board 80 is difficult to be influenced by the deflection deformation in the first case 2. More particularly, the second circuit board 80 is arranged on the coupling portion 4 side, which is high in rigidity and difficult to deform, and therefore, the second circuit board 80 is difficult to be influenced by the deflection deformation in the direction Y. This further reduces loss of functionality to the sub antenna 85 and the digital TV antenna 86.

In the second circuit board 80, when the direction R (second direction) of the second circuit board 80 is substantially orthogonal to the direction Y (i.e., when the lateral direction of the second circuit board 80 is substantially parallel to the direction Y or the like), the second circuit board 80 is difficult to be deformed by the deflection in the first case 2. This further reduces loss of functionality to the sub antenna 85 and the digital TV antenna 86.

The sub antenna 85 and the digital TV antenna 86 is mounted on the second circuit board 80 which hardly deforms in the direction Y (P) even when the first case 2 and the first circuit board 70 are deformed so as to be deflected in the direction Y (P). Therefore, influence of the deformation of the second circuit board 80 is small, and this reduces loss of functionality to the sub antenna 85 and the digital TV antenna 86.

The sub antenna 85 and the digital TV antenna 86 are arranged such that the direction Q (third direction) is substantially orthogonal to the direction Y (fourth direction) and the direction P (first direction). In other words, the sub antenna 85 and the digital TV antenna 86 are arranged such that the lateral direction coincides with (parallels to) the direction P (first direction).

That is, the sub antenna 85 and the digital TV antenna 86 are arranged so as to be difficult to deform even when the second circuit board 80 is deformed. This suppresses loss of functionality to the sub antenna 85 and the digital TV antenna 86.

In this way, various embodiments provide the following advantage. The sub antenna 85 and the digital TV antenna 86 are arranged such that the direction Q (third direction) is substantially orthogonal to the direction P (first direction) in the first circuit board 70. This suppresses loss of functionality to the sub antenna 85 and the digital TV antenna 86 even when an impact that makes the first circuit board 70 deflect in the direction P is applied to the mobile phone 1.

The second circuit board 80 on which the sub antenna 85 and the digital TV antenna 86 are mounted is arranged so that the direction R (second direction) is substantially orthogonal to the direction P (first direction) in the first circuit board 70. This suppresses the generation of deformation in the second circuit board 80 when an impact that makes the first circuit board 70 deflect in the direction R is applied to the mobile phone 1. This suppresses loss of functionality to the sub antenna 85 and the digital TV antenna 86 even when an impact that makes the first circuit board 70 deflect in the direction P is applied to the mobile phone 1.

The second circuit board 80 on which the sub antenna sub antenna 85 and the digital TV antenna 86 are mounted is arranged so that the direction R (second direction) is substantially orthogonal to the direction Y (fourth direction). This suppresses the generation of deformation in the second circuit board 80 when an impact that makes the first case 2 deflect in the direction Y is applied to the mobile phone 1. This suppresses loss of functionality to the sub antenna 85 and the digital TV antenna 86 even when an impact that makes the first case 2 deflect in the direction Y is applied to the mobile phone 1.

An impact and vibration due to a drop, both of which are transmitted to the first circuit board 70, are absorbed by the plate spring terminal 74 and are difficult to be transmitted to the second circuit board 80. On the free end side in the second circuit board 80, the plate spring terminal 74 is arranged on the third surface 82 side and the spring pin terminal 84 is arranged on the fourth surface 83 side in face-to-face relation; and therefore, vibration generated on the free end side is appropriately absorbed.

That is, the impact and vibration due to a drop or the like are not transmitted to the second circuit board 80 or are immediately absorbed. The absorption or lack of transmission of impact and vibration suppresses loss of functionality to the sub antenna 85 and the digital TV antenna 86 to be mounted on the second circuit board 80.

The directions of the sub antenna 85 and the digital TV antenna 86 are substantially orthogonal to the direction Y. Therefore, the sub antenna 85 and the digital TV antenna 86 mounted on the second circuit board 80 are difficult to be influenced by the deflection of the first circuit board 70 due to an impact such as a drop. Therefore, loss of functionality to the electronic components such as the sub antenna 85 and the digital TV antenna 86 and the like mounted on the second circuit board 80 can be suppressed.

The second circuit board 80 is flexibly held so as to absorb an impact in the direction Z by the biasing force of the plate spring terminal 74 and the spring pin terminal 84. Therefore, even when an impact such as a drop is applied to the second circuit board 80, the impact is absorbed by the plate spring terminal 74 and the spring pin terminal 84, and therefore, the impact on the second circuit board 80 is reduced. Then, the deflection of the second circuit board 80 is suppressed. As a result, for example, even when electrical components susceptible to an impact, such as the sub antenna 85 and the digital TV antenna 86 and the like are mounted on the second circuit board 80, loss of functionality due to an impact such as a drop can be reduced.

The second circuit board 80 is flexibly held so as to absorb an impact by the plate spring terminal 74 and the spring pin terminal 84; and therefore, the second circuit board 80 can ensure a good energized state to the first circuit board 70 and the antenna element 91.

When the second circuit board 80 is smaller than the first circuit board 70, deflection with respect to an impact such as a drop is suppressed; and therefore, loss of functionality of the electrical components such as the sub antenna 85 and the digital TV antenna 86 and the like mounted on the second circuit board 80 can be reduced.

The second circuit board 80 is smaller than the first circuit board 70; and therefore, arrangement flexibility for the mobile phone 1 of the second circuit board 80 is improved. Therefore, in the mobile phone 1 of the present embodiment, loss of functionality due to an impact such as a drop to the electrical components such as the sub antenna 85 and the digital TV antenna 86 and the like can be reduced and design flexibility is improved.

The plate spring terminal 74 and the spring pin terminal 84 are arranged in substantially face-to-face relation via the second circuit board 80. Therefore, the second circuit board 80 is supported by the plate spring terminal 74 and the spring pin terminal 84 at the same positions on the third surface 82 and the fourth surface 83 via the second circuit board 80. Therefore, the second circuit board 80 is flexibly held by the plate spring terminal 74 and the spring pin terminal 84 in the direction Z so as to absorb an impact. Therefore, an impact such as a drop can be absorbed; and therefore, the deflection of the second circuit board 80 can be reduced. As a result, loss of functionality due to an impact such as a drop to the electrical components such as the sub antenna 85 and the digital TV antenna 86 and the like mounted on the second circuit board 80 can be reduced.

The first spring constant of the plate spring terminal 74 is larger than the second spring constant of the spring pin terminal 84; where, the first spring constant and the second spring constant mean all or a synthetic spring constant in the case where a plurality of terminals are provided. That is, a synthetic first spring constant may be larger than a synthetic second spring constant. More specifically, as mentioned above, in the case where the plate spring terminal 74 or the spring pin terminal 84 is provided in plural, a configuration may be made such that the total spring constant thereof is larger than the second spring constant of the spring pin terminal 84. The total spring constant thereof may be larger than the second spring constant of the spring pin terminal 84 even if the spring constant of individual plate spring terminal 74 is substantially small.

For example, a range of compression and extension of the plate spring terminal 74 is smaller than that of the spring pin terminal 84. The second circuit board 80 is arranged on the rear case 22 side with respect to the engaging claw portion 122 by the biasing force of the plate spring terminal 74 and that of the spring pin terminal 84. Therefore, the second circuit board 80 is flexibly held so that the plate spring terminal 74 and the spring pin terminal 84 absorb an impact in a state where the second circuit board 80 does not come in contact with the engaging member 120. As a result, loss of functionality to the electrical component such as the sub antenna 85 and the digital TV antenna 86 and the like mounted on the second circuit board 80 can be suppressed.

The free end side is held by the plate spring terminal 74 and the spring pin terminal 84, and therefore, at the time of an impact such as a drop, one end portion side of the second circuit board 80 is surely fixed to the fixed portion 115 and the impact can be absorbed on the free end side. Therefore, the deflection of the second circuit board 80 can be suppressed; and accordingly, the loss of functionality of the electrical component such as the sub antenna 85 and the digital TV antenna 86 and the like mounted on the second circuit board 80 can be suppressed.

A configuration is made such that the sub antenna 85 and the digital TV antenna 86 are mounted on the second circuit board 80, the radio unit 71a is provided on the first circuit board 70, and the plate spring terminal 74 is made to conduct a radio signal. Therefore, the plate spring terminal 74 is made to conduct radio signals received or transmitted by the sub antenna 85 and the digital TV antenna 86 mounted on the second circuit board 80, and a connection can be made to the radio unit of the first circuit board 70. Therefore, even if the sub antenna 85 and the digital TV antenna 86 are separately provided from the radio unit 71a on different circuit boards, these can be conducted by a simple configuration.

In the aforementioned embodiment, the second circuit board 80 is elongated (i.e., rectangle) in the direction Q (third direction); however, the second circuit board 80 may be, for example but without limitation, square, and the like.

While at least one exemplary embodiment has been presented in the foregoing detailed description, the present invention is not limited to the above-described embodiment or embodiments. Variations may be apparent to those skilled in the art. In carrying out the present invention, various modifications, combinations, sub-combinations and alterations may occur in regard to the elements of the above-described embodiment insofar as they are within the technical scope of the present invention or the equivalents thereof. The exemplary embodiment or exemplary embodiments are examples, and are not intended to limit the scope, applicability, or configuration of the invention in any way. Rather, the foregoing detailed description will provide those skilled in the art with a template for implementing the exemplary embodiment or exemplary embodiments. It should be understood that various changes can be made in the function and arrangement of elements without departing from the scope of the invention as set forth in the appended claims and the legal equivalents thereof. Furthermore, although embodiments of the present invention have been described with reference to the accompanying drawings, it is to be noted that changes and modifications may be apparent to those skilled in the art. Such changes and modifications are to be understood as being comprised within the scope of the present invention as defined by the claims.

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. The term "about" when referring to a numerical value or range is intended to encompass values resulting from experimental error that can occur when taking measurements.

The invention claimed is:

1. A mobile electronic device comprising:
a first case elongated in a first direction;
a first circuit board enclosed in the first case;
a second circuit board smaller in size than the first circuit board, enclosed in the first case, and elongated in a second direction substantially perpendicular to the first direction;
one or more electrical components located on the second circuit board, and elongated in a fourth direction; and
a third circuit board, enclosed in the first case, the third circuit board comprising elements for providing user input functions.

2. The mobile electronic device according to claim 1, wherein the first circuit board is elongated in a third direction substantially perpendicular to the second direction.

3. The mobile electronic device according to claim 2, wherein the third direction is substantially perpendicular to the fourth direction.

4. The mobile electronic device according to claim 1, wherein the electrical components comprise a ceramic antenna.

5. The mobile electronic device according to claim 1, wherein at least one part of the first circuit board and at least one part of the second circuit board face each other in a thickness direction of the first case.

6. The mobile electronic device according to claim 1, wherein the second circuit board is located on an end in the first direction of the first case.

7. A mobile electronic device comprising:
a first case elongated in a first direction;
a first circuit board enclosed in the first case;
a second circuit board smaller in size than the first circuit board, enclosed in the first case, and elongated in a second direction substantially perpendicular to the first direction;
one or more electrical components are located on the second circuit board, and elongated in a fourth direction, wherein at least one part of the first circuit board and at least one part of the second circuit board face each other in a thickness direction of the first case;
   a first spring terminal located between the first circuit board and the second circuit board, biasing the second circuit board; and
   a second spring terminal located on the second circuit board on an opposite side to the first spring terminal, biasing the second circuit board, wherein
   the second circuit board comprises a fixed end and a free end, and
   the first spring terminal and the second spring terminal are closer to the free end than a center between the fixed end and the free end.

8. The mobile electronic device according to claim 7, wherein the first spring terminal electrical and the second spring terminal substantially face each other, and sandwich the second circuit board therebetween.

9. The mobile electronic device according to claim 8, wherein the first spring terminal and the second spring terminal substantially face each other and are in contact with the second circuit board.

10. The mobile electronic device according to claim 7, wherein the first spring terminal has a first spring constant greater than a second spring constant of the second spring terminal.

11. The mobile electronic device according to claim 7, wherein the first spring terminal has a range of compression and extension smaller than that of the second spring terminal.

12. The mobile electronic device according to claim 7, further comprising:
   two engaging members on an inner surface of the first case operable to:
   regulate a movement of the second circuit board toward the first circuit board, sandwiching the second circuit board at two ends in the second direction of the second circuit board; and
   engage the second circuit board from a side of the first circuit board.

13. The mobile electronic device according to claim 7, further comprising a wireless communication unit on the first circuit board, wherein the first spring terminal has an electrical conductivity and is operable to pass a signal between the wireless communication unit and the electronic component therethrough.

14. The mobile electronic device according to claim 13, wherein the wireless communication unit is operable to communicate with a base station coupled to a wireless network.

15. A mobile electronic device comprising:
a first case elongated in a first direction;
a first circuit board enclosed in the first case;
a second circuit board smaller in size than the first circuit board, enclosed in the first case, and elongated in a second direction substantially perpendicular to the first direction;
one or more electrical components are located on the second circuit board, and elongated in a fourth direction, wherein at least one part of the first circuit board and at least one part of the second circuit board face each other in a thickness direction of the first case;
   a first spring terminal located between the first circuit board and the second circuit board, biasing the second circuit board;
   a second spring terminal located on the second circuit board on an opposite side to the first spring terminal, biasing the second circuit board;
   a second case;
   a coupling portion coupling the first case and the second case, the coupling portion comprising:
      a hinge member; and
      a containing portion operable to detachably contain the hinge member; and
   a regulating member regulating a movement to a separation direction of the hinge member and contacting with the second circuit board.

16. A mobile electronic device comprising:
a first case elongated in a first direction;
a first circuit board enclosed in the first case;
a second circuit board smaller in size than the first circuit board, enclosed in the first case, and elongated in a second direction substantially perpendicular to the first direction;
one or more electrical components are located on the second circuit board, and elongated in a fourth direction, wherein at least one part of the first circuit board and at least one part of the second circuit board face each other in a thickness direction of the first case;
   a first spring terminal located between the first circuit board and the second circuit board, biasing the second circuit board; and
   a second spring terminal located on the second circuit board on an opposite side to the first spring terminal, biasing the second circuit board, wherein the second spring terminal has an electrical conductivity and electrically couples the electronic component and an antenna element.

* * * * *